SEMICONDUCTOR DEVICES HAVING MODIFIER-CONTAINING SURFACE OXIDE LAYER

Original Filed Jan. 19, 1962

4 Sheets-Sheet 1

INVENTORS
JOSEPH H. SCOTT, JR.
& JOHN A. OLMSTEAD
BY [signature]

INVENTORS
JOSEPH H. SCOTT, JR. &
JOHN A. OLMSTEAD
BY Glenn H. Bowestle

Sept. 5, 1967 J. H. SCOTT, JR., ETAL 3,340,445

SEMICONDUCTOR DEVICES HAVING MODIFIER-CONTAINING SURFACE OXIDE LAYER

Original Filed Jan. 19, 1962

4 Sheets-Sheet 3

INVENTORS
JOSEPH H. SCOTT, JR. &
JOHN A. OLMSTEAD

BY Glenn H. Brunette

INVENTORS
JOSEPH H. SCOTT, JR. &
JOHN A. OLMSTEAD

BY Glenn H. Bruestle 3,340,445

SEMICONDUCTOR DEVICES HAVING MODIFIER-CONTAINING SURFACE OXIDE LAYER

Joseph H. Scott, Jr., Newark, and John A. Olmstead, Branchburg Township, Somerset County, N.J., assignors to Radio Corporation of America, a corporation of Delaware Original application Jan. 19, 1962, Ser. No. 167,341, now Patent No. 3,200,019, dated Aug. 10, 1965. Divided and this application Dec. 23, 1964, Ser. No. 420,523
1 Claim. (Cl. 317—234)

This application is a division of application Ser. No. 167,341, filed Jan. 19, 1962, issued Aug. 10, 1965, as U.S. Patent 3,200,019.

This invention relates to improved semiconductor devices and improved methods of making them. More particularly, the invention relates to an improved method of controlling the size and shape of rectifying barriers introduced in bodies of semiconductive materials, and improved semiconductor devices fabricated thereby.

One method of making junction type semiconductor devices includes the step of heating a given conductivity type semiconductive body in an ambient containing a conductivity type-determining substance capable of imparting opposite conductivity type to the particular semiconductor employed. The ambient is usually a vapor but may a liquid, or even a powdered solid containing a doping agent, as described in U.S. Patent 2,870,050, issued Jan. 20, 1959, to C. W. Mueller and J. M. Printon, and assigned to the assignee of this application. In the later case, the powdered solid emits vapors of the doping agent, so that diffusion takes place from the vapors into the solid semiconductive body. The conductivity type-determining substance, which is also known in the art as an impurity or a doping agent or a conductivity type modifier, may be either an acceptor or a donor, and diffuses from the ambient into the semiconductive body to a depth determined by the temperature and duration of heating, as well as by the diffusion constant of the impurity in the semiconductor. Since a surface layer of the semiconductive body is thereby converted to opposite conductivity type, a rectifying barrier known as a PN junction is formed at the interface between the given conductivity type bulk of the wafer and the impurity-diffused surface layer. The rectifying barrier thus produced extends over the entire surface of the wafer unless portions of the surface are masked to confine the diffusion to a particular area. However, in the fabrication of the semiconductor devices such as transistors and the like, it is necessary to control with precision the size and shape of the rectifying barriers formed in the semiconductive wafer. Since these solid state devices are inherently small, such precise control is difficult to attain.

It is known to control the size and shape of rectifying barriers formed in a semiconductor wafer by masking portions of the wafer surface with a semiconductor oxide coating prior to the diffusion step. The impurity material diffuses selectively into the wafer, with diffusion being considerably (orders of magnitude) faster into those wafer surface regions which are not masked than into those wafer regions underlying surface portions masked with oxide coating. However, the PN junctions thus fabricated are not as uniform in respect to precise size, shape, and impurity concentration of the diffused region as is desirable for the fabrication of devices with reproducible and uniform electrical parameters.

It is therefore an object of this invention to provide improved semiconductor devices.

Another object of the invention is to provide an improved method of fabricating improved semiconductor devices.

But another object of the invention is to provide an improved method of introducing rectifying barriers in semiconductor wafers.

Yet another object is to provide an improved method of controlling the concentration of a conductivity type-determining substance in a semiconductive body.

Still another object is to provide an improved method of controlling the size and shape of rectifying barriers in semiconductive bodies.

These and other objects of the invention are attained by providing semiconductor devices fabricated by a process which includes the steps of, first, depositing on at least a portion of the surface of a semiconductive body a coating of silicon oxide which contains a conductivity type modifier. The semiconductive body is then heated so as to diffuse the conductivity type modifier from the silicon oxide coating into the semiconductive body. Diffusion of the conductivity type modifier thus occurs from the doped silicon oxide coating into that portion only of the semiconductive body which is immediately beneath the coating, and may be described as solid-to-solid diffusion. The doped silicon oxide coating may be removed, or may be permitted to remain on the surface of the completed device.

The invention will be described in greater detail in connection with the accompanying drawing, in which.

Figure 1:
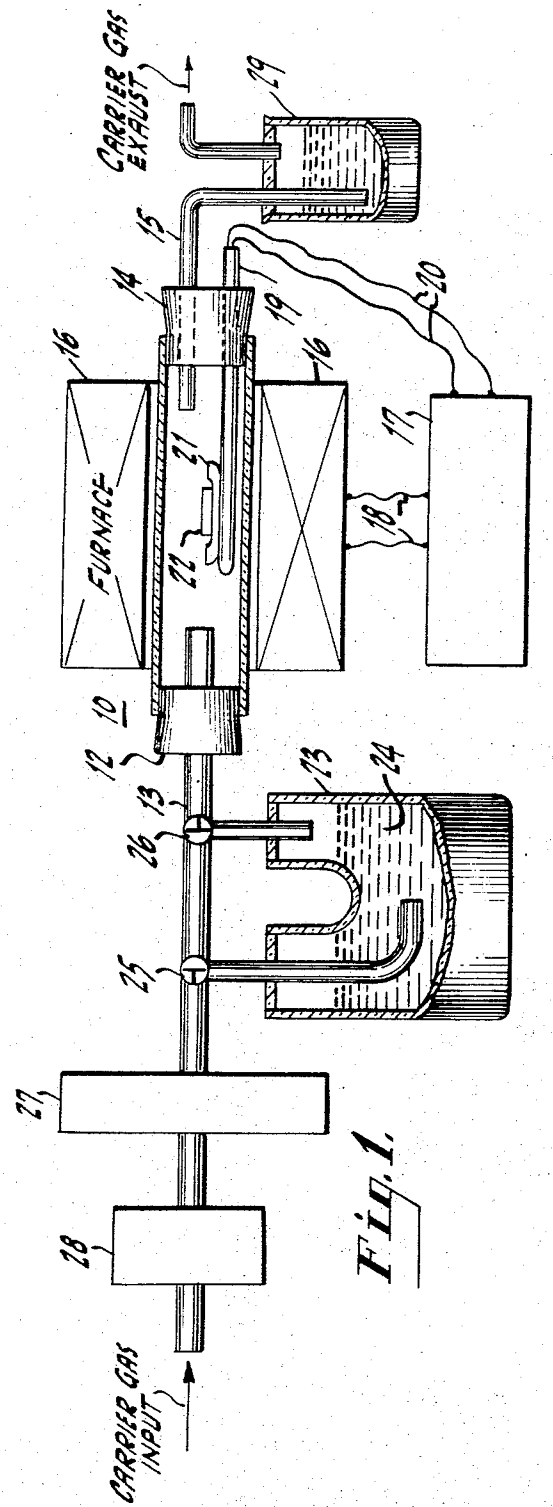
FIGURE 1 is a cross-sectional schematic view of one form of apparatus useful in the practice of the invention.

FIGURES *3a–3d* are cross-sectional elevational views illustrating successive steps in the fabrication of a semiconductor device according to one embodiment of the invention;

FIGURES *4a–4e* are cross-sectional elevational views illustrating successive steps in the fabrication of a plurality of semiconductive devices according to another embodiment of the invention; and FIGURES *5a–5j* are cross-sectional elevational views illustrating successive steps in the fabrication of a semiconductor junction device according to still another another embodiment of the invention.

Similar reference characters are applied to similar elements throughout the drawing.

A semiconductor oxide coating useful as a diffusion mask on a semiconductive wafer may be genetically derived from the semiconductor body itself, for example by heating a silicon body in the presence of an oxidizing agent so as to convert a surface layer of silicon to silicon oxide. The oxidizing agent may for example be water vapor. This method is not suitable for other semiconductors such as germanium and the III–V compounds, which are more sensitive to oxidation than silicon. Germanium oxide sublimes at the temperatures required for diffusion and hence cannot be utilized as a diffusion mask. Furthermore, the thickness of the semiconductor wafer is reduced by a variable amount when a wafer surface layer is oxidized, the reduction in wafer thickness depending upon the depth of the oxidized layer. This introduces an undesirable variation in the distance between rectifying barriers in the wafer and hence results in undesirable variations in the electrical characteristics of junction devices made from such semiconductor wafers.

Silicon oxide coatings have been deposited by vacuum evaporation on masked semiconductive wafers in order to restrict the lateral spread of alloyed electrodes on the surface of the wafers, as described in U.S. Patent 2,796,952, issued June 18, 1957, to S. G. Ellis et al., and assigned to the assignee of this application. Such evaporated silicon oxide coatings are satisfactory for the fabrication of surface alloyed devices, but are not sufficiently adherent when deposited on germanium wafers, are sometimes adversely affected by the action of common solvents such as water and acetone, and hence are not entirely satisfactory when utilized as a mask in diffusion processes. Moreover, such methods require expensive special equipment such as vacuum furnaces and the like.

Silicon monoxide coatings can also be formed on silicon wafers by immersing the wafers in a HF-$H_2O_3$ oxidizing bath, and silicon dioxide coatings formed over the silicon monoxide by electrolytic anodization, as described in U.S. Patent 2,875,384, issued Feb. 24, 1959, to J. T. Wallmark, and assigned to the assignee of this application. Such oxide coatings have been found advantageous in stabilizing the surface characteristics and electric parameters of a completed junction device, but their preparation as diffusion masks is too time consuming for some commercial uses.

Another method of depositing a silicon oxide coating on a semiconductor wafer is to heat the suitably prepared wafer in the vapors of an organic siloxane compound at a temperature below the melting point of the semiconductor but above the temperature at which the siloxane compound decomposes, so that an inert adherent coating believed to consist principally of silicon oxides is formed on the wafer surface.

A method of applying a doped silicon oxide coating to a semiconductive body, and apparatus useful for this purpose, will now be described.

DESCRIPTION OF ONE APPARATUS

One form of apparatus useful in the practice of the invention is illustrated in FIGURE 1. The apparatus 10 comprises a refractory furnace tube 11, which may, for example, consist of a high melting glass, or of fused silica, or the like. Furnace tube 11 has at one end a stopper 12 containing an inlet tube 13, and at the other end a stopper 14 containing an outlet tube 15. Around a central portion of furnace tube 11 is a furnace 16, which may, for example, be an electrical resistance furnace. Advantageously, the temperature of furnace 16 is kept within the desired range by means of a controller 17, which is connected by a pair of electrical lead wires 18 to the furnace 16. Furnace tube 11 contains a quartz temperature-sensing element 19 which is mounted in outlet stopper 14. The temperature-sensing element 19 contains a temperature-sensitive element such as a thermocouple (not shown) which is connected by a pair of electrical lead wires 20 to controller 17. A holder 21 is supported by the temperature-sensing element 19. The semiconductor wafer 22 to be treated is placed on the holder 21. A gas bubbler 23 feeds into the inlet tube 13. The bubbler 23 contains a liquid 24 consisting of an organic siloxane compound in which is dissolved a substance that modifies the conductivity type of the particular semiconductor being processed, that is, a substance which is a suitable doping agent for the particular semiconductor. Inlet tube 13 also includes stopcocks 25 and 26 at the entrance and exit respectively of bubbler 23. The bubbler 23 may thus be bypassed when desired by means of stopcocks 25 and 26. Ahead of the bubbler 23 in the gas train is a gas dryer 27 and a flowmeter 28 for controlling the flow of the inert carrier gas (which is introduced into the system from the gas source (not shown), which may be a tank or a line. The outlet tube 15 leads to a gas scrubber 29. The carrier gas is swept through the apparatus 10 in the direction indicated by the arrows, and leaves scrubber 29 by way of the exhaust. Suitably the inlet tube 13, the outlet tube 15, the holder 21, and the scrubber 29 are all made of a refractory material such as fused quartz.

*Example 1*

A donor-doped silicon oxide coating may be deposited on a semiconductive wafer, using the apparatus described above, as follows. The semiconductive wafer 22, which in this example consists of P-type silicon, is etched, cleaned, dried, then positioned on the holder 21 and introduced into the furnace tube 11. Furnace tube 11 is stoppered and suitably positioned in furnace 16. In this example, the furnace controller 17 is set to maintain the temperature inside furnace tube 11, at about 750° C. Most organic siloxane compounds begin to decompose at 600° C. The inert carrier gas utilized may for example be nitrogen, argon, helium, and the like. Hydrogen and hydrogen-nitrogen mixtures known as forming gas may also be utilized as the carrier gas. In this example, the carrier gas consists of argon, the liquid siloxane compound 24 in bubbler 23 consists of ethyl silicate, and the conductivity-type modifier or doping agent dissolved therein consists of trimethyl phosphate. The proportions of the siloxane compound and the conductivity type modifier may be varied to obtain different concentrations of the doping agent or active impurity in the completed device. In this example, the liquid 24 consists of 9 milliliters ethyl silicate and 1 milliliter trimethyl phosphate.

Line argon is passed through the system at the rate of about 2 cubic feet per hour while the furnace 16 is warmed to the desired temperature. During this period the bubbler 23 is bypassed. When the temperature inside furnace tube 11 has reached 750° C., the flow of argon is switched by means of stopcocks 25 and 26 so as to bubble through the doped siloxane liquid 24. The mixed vapors of ethyl silicate and trimethyl phosphate are swept by the argon through the inlet tube 13 to the furnace tube 11, where they are decomposed. A coating of phosphorus-containing silicon oxide (shown as 34 in FIGURE 3) is thus deposited on the semiconductive wafer 22. The carrier gas and the remaining decomposition products leave the system by way of exhaust. After about 10 to 20 minutes of deposition of the doped silicon oxide layer, the flow of the carrier gas is switched back by means of stopcocks 25 and 26, that is, the bubbler 23 is again bypassed, and the furnace 16 is shut off. When the temperature inside the furnace tube 11 has dropped to about 200° C., the flow of the carrier gas may be turned off completely and the wafer 22 removed from the furnace tube 11. The wafer 22 is now ready for processing, either to remove a portion of the doped silicon oxide layer, or for direct diffusion of the phosphorus from the doped silicon oxide layer into the portion of the wafer immediately beneath the layer.

*Example II*

An acceptor doped silicon oxide coating may be deposited on a semiconductive wafer in a manner similar to that described above in Example I. In this example, the liquid 24 inside bubbler 23 consists of 10 milliliters ethyl silicate and 1 milliliter trimethyl borate. The semiconductive wafer 22 in this example is a crystalline material selected from the group consisting of germanium, silicon, and germanium-silicon alloys. The furnace temperature is set by the controller to maintain a temperature of about 730° C. inside furnace tube 11. The process is otherwise similar to that described above in Example I. The acceptor doped silicon oxide coating (shown as 54 in FIGURE 5) thus deposited on the semiconductive wafer 22, contains boron uniformly distributed throughout the coating. The wafer 22 may now be processed to remove a portion of the boron-doped silicon oxide layer, and then heated to diffuse boron from the remaining portion of the silicon oxide layer directly into the portion of the wafer immediately therebeneath.

DESCRIPTION OF ALTERNATIVE APPARATUS

Alternatively, an organic siloxane compound may be thermally decomposed, and the decomposition products of the compound forced through a jet so as to impinge upon and coat a semi-conductive body with silicon oxide. The special utility of this method is that it requires only moderate heating of the semiconductive body. The method for forming a doped silicon oxide coating on a semiconductive body at moderate temperatures, and apparatus useful for this purpose, will now be described.

Figure 2:
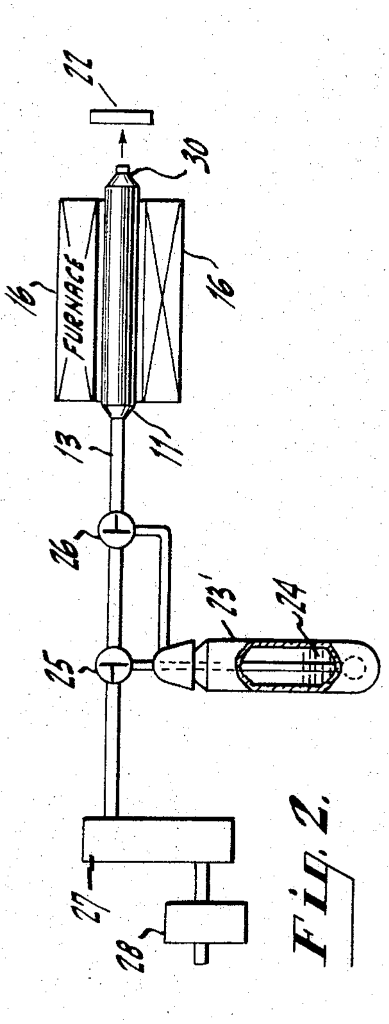
FIGURE 2 is a cross-sectional schematic view of another form of apparatus useful in the practice of the invention.

An alternative form of apparatus useful in the practice of the invention is illustrated in FIGURE 2. The apparatus 10' comprises a flow meter 28 for regulating the flow of the carrier gas, a dryer or drying column 27 for purification of the carrier gas, and an inlet tube 13 provided with stopcocks 25 and 26 for bypassing a bubbler 23'. The bubbler 23' of this example is somewhat different in form from that described above in connection with FIGURE 1, but contains a similar liquid mixture 24 consisting of an organic siloxane compound with a doping agent, and functions in a similar manner. The organic siloxane compound may, for example, consist of ethyl triethoxysilane. Inlet tube 13 is attached to one end of furnace tube 11. The tube 11 is surrounded by furnace 16, which is maintained at about 700° C. Since siloxane compounds generally begin to decompose at about 600° C., this temperature is sufficient to insure pyrolysis of siloxane vapors introduced to the furnace. The mixed vapors of the inert carrier gas, the doping agent, and the thermal decomposition products of the siloxane compound exit from the other end of furnace tube 11 by way of a jet 30, and the jet stream (not shown) thus formed impinges upon the semiconductive wafer 22. The jet stream cools off rapidly as it leaves the jet 30, and hence the temperature of the jet stream at the point where it impinges on the semiconductive wafer may be varied by adjusting the distance between the jet or orifice 30 and the wafer 22. For a furnace temperature of about 700° C., and a separation between jet 30 and wafer 22 of about 2 millimeters, the temperature of the jet impinging on the wafer is about 150° C. It is thus seen that doped silicon oxide coatings can be deposited by this technique on semiconductor wafers while maintaining the wafer at very moderate temperatures. This technique is particularly useful with low energy gap semiconductors, which cannot withstand high temperatures.

Methods of fabrication of semiconductor junction devices in accordance with the principles of the invention will now be described.

*Example III*

Figures 3A, 3B, 3C, 3D, 4A, 4B, 4C, 4D, 4E:
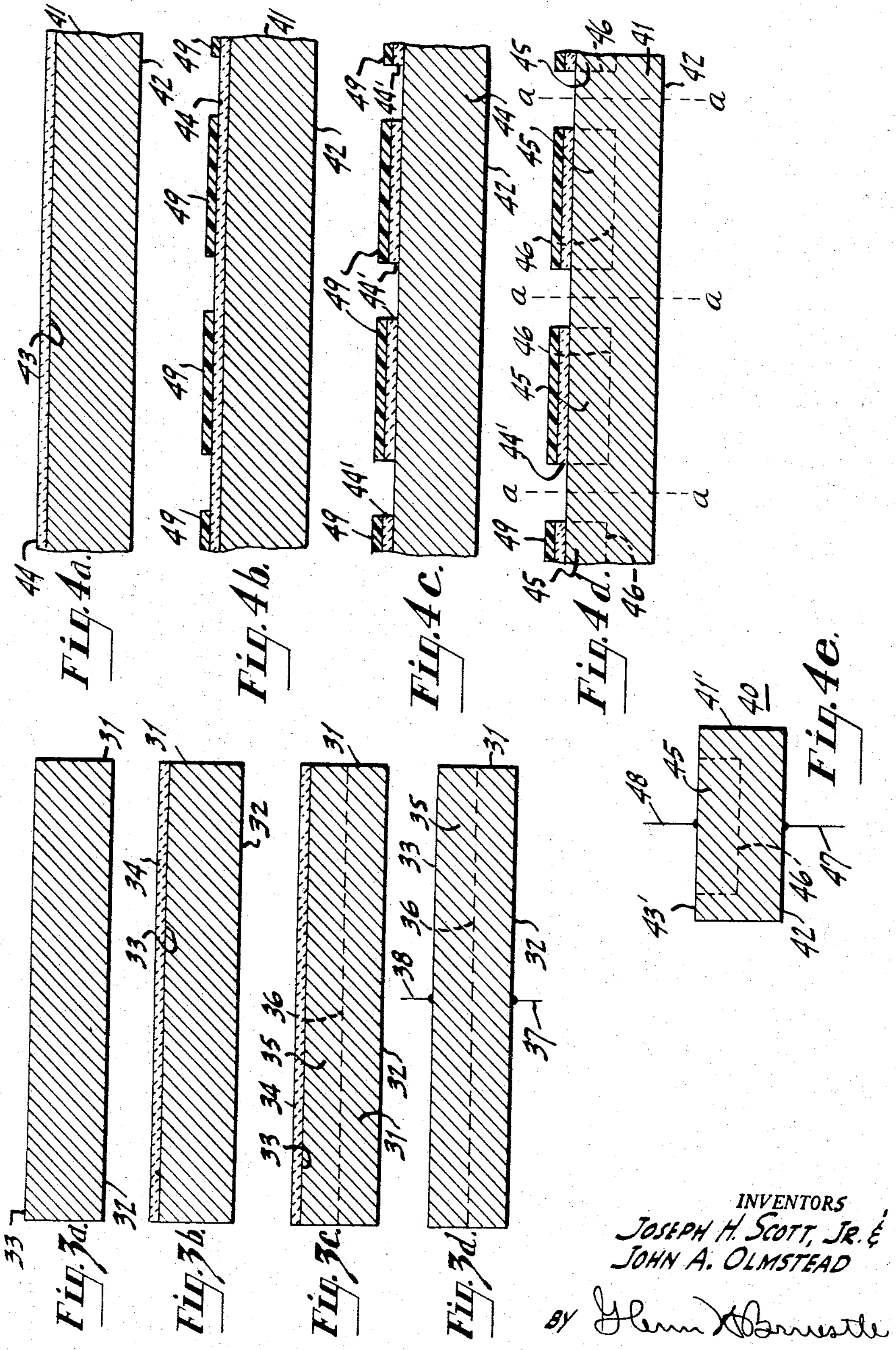
Figure 5A:
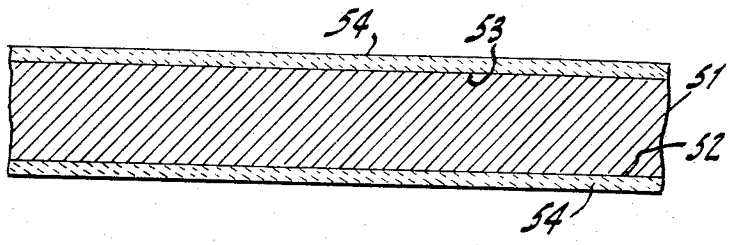
Figure 5B:
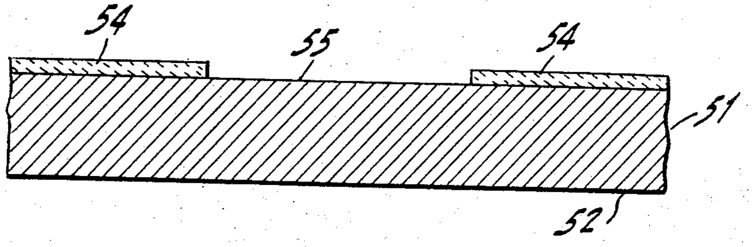
Figure 5C:
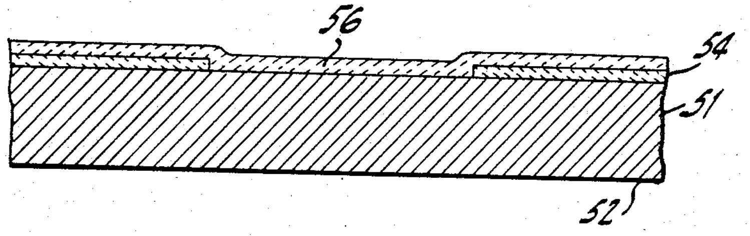
Figure 5D:
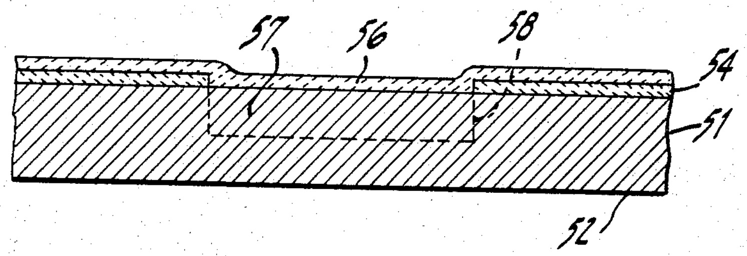
Figure 5E:
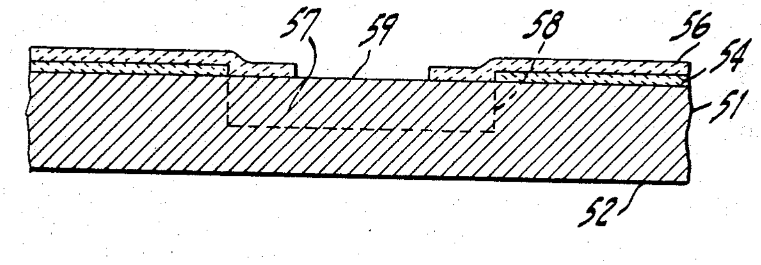
Figure 5F:
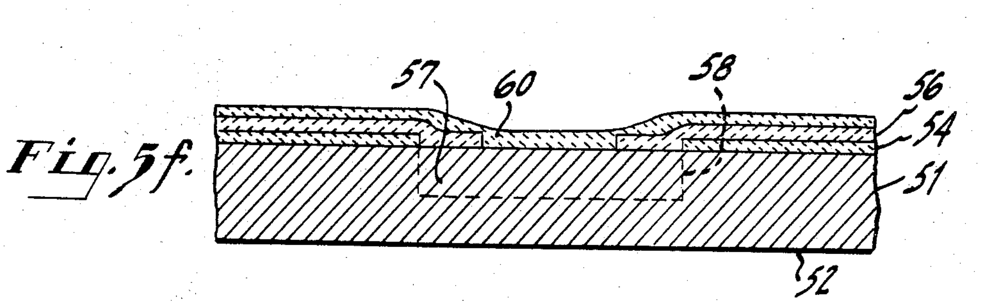
Figures 5G, 5H, 5I:
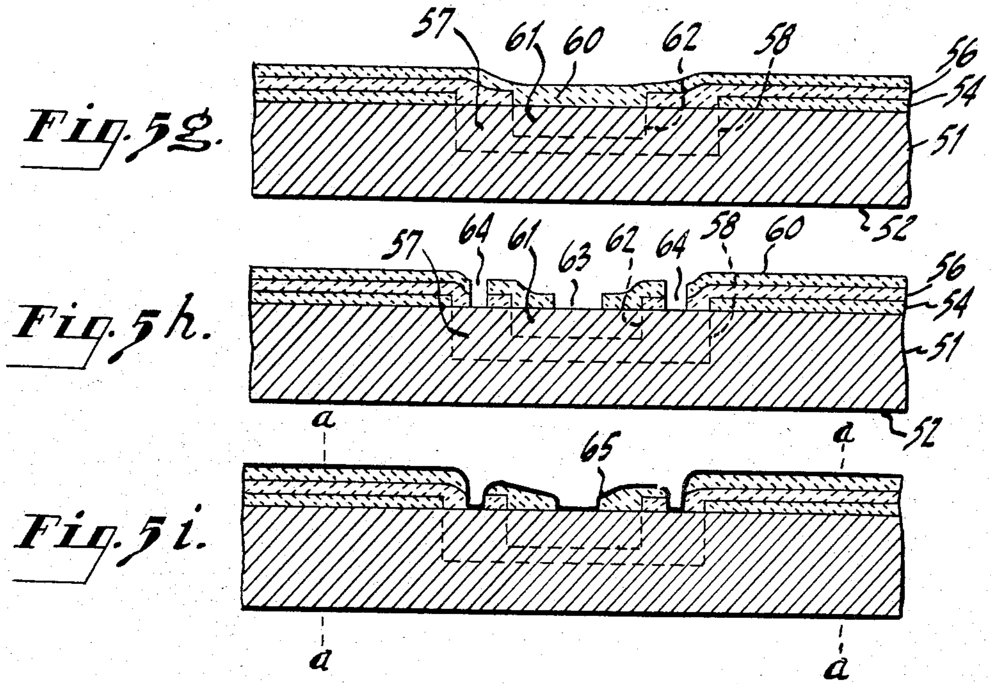
Figure 5J:
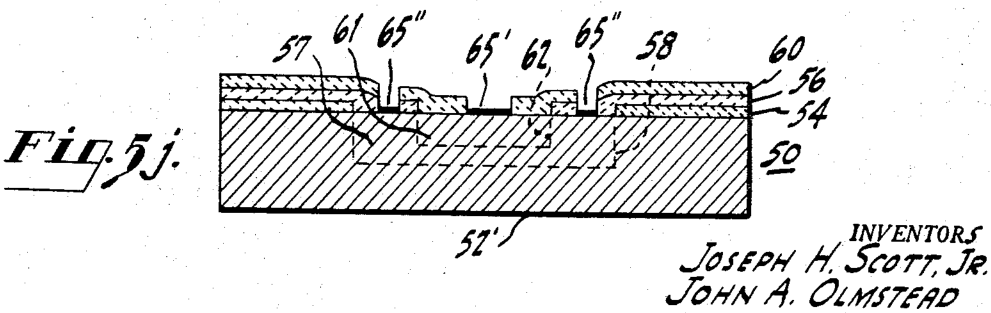

Referring now to FIGURE 3*a* of the drawing, a wafer 31 of crystalline semiconductive material is prepared with two opposing major faces 32 and 33 respectively. In this example, wafer 32 consists of a P-type monocrystalline germanium-silicon alloy. Monocrystalline germanium-silicon alloys and their preparation are described in U.S. Patent 2,997,410, issued Aug. 22, 1961, to B. Selikson, and assigned to the assignee of this application. The wafer 31 is positioned with one major face 32 down on the holder 21 of the apparatus illustrated in FIGURE 1, and is treated as described in Example I to form a phosphorus-doped silicon oxide coating 34 (FIGURE 3*b*) on the exposed major wafer face 33. Any oxide coating 34 on the ends of the wafer is removed by trimming the ends. Conveniently, a relatively large slice of semiconductive material may be treated in this manner, or a plurality of such slices, and subsequently diced into wafers or dies of the appropriate size and shape.

The coated wafer 31 is now heated in a hydrogen atmosphere for about 30 minutes at about 1100° C. During this step, phosphorus diffuses from the doped silicon oxide coating 34 into the wafer portion 35 (FIGURE 3*c*) immediately beneath coating 34. The depth of diffusion of the doping agent varies as the temperature and time employed for this heating step. Since phosphorus is a donor in germanium and silicon and germanium-silicon alloys, the phosphorus-diffused region 35 is converted to N-type conductivity. A rectifying barrier 36 known as a PN junction is thus formed at the interface between the phosphorus-diffused N-type region 35 and the P-type bulk of the wafer.

To complete the device, the doped silicon oxide coating 34 is removed by washing wafer 31 in hydrofluoric acid. Lead wires 37 and 38 are then ohmically attached to wafer faces 32 and 33 respectively by any convenient technique known to the art.

It will be recognized that the device thus fabricated is a two-terminal rectifier or diode, but this is by way of example only, since various multijunction and multielectrode semiconductor devices may be fabricated in a similar manner by the method of this invention.

An important advantage of junction devices fabricated according to the invention is that the PN junctions formed therein are both uniform and flat over their extent. The uniformity of the diffused regions fabricated according to the invention may be attributed to the fact that the acceptor or donor impurity which is to be diffused into the wafer is uniformly distributed in the silicon dioxide coating before the actual diffusing is done. This avoids the variations in diffusion caused by variations in the flow rate and flow pattern of the carrier gas in prior art vapor-to-solid diffusion methods. However, it will be understood that the practice and advantages of the invention are not dependent upon any particular theory selected to explain the improved results thus attained.

Another advantage of the invention is that a desired surface concentration of the impurity material on the selected surfaces of the semiconductor wafers may be reproducibly attained. Variation of only 10% and less have been observed for the sheet conductivity of semiconductive wafers into which an acceptor or donor has been diffused by the methods of the invention.

Still another advantage of the invention is that the concentration of the impurity in the surface of the wafer where desired, may be varied from an extremely low selected limit up to the limit of solubility of the impurity in the semiconductor by varying the concentration of the doping agent in the silicon oxide layer, the diffusion temperature, and the period of diffusion. Boron has been diffused from boron-doped silicon oxide coatings into silicon wafers, to obtain wafer surface concentrations which varied from about $5\times10^{16}$ to $5\times10^{20}$ boron atoms per cm.$^3$. Similarly, phosphorus atom concentrations on wafer surfaces have been varied from about $10^{16}$ to $10^{21}$ atoms per cm.$^3$. In one instance, a surface concentration of approximately $9\times10^{15}$ donor impurity atoms per cm.$^3$ was obtained on a wafer which contained $4\times10^{15}$ acceptor impurity atoms per cm.$^3$. In contrast, most prior art diffusion methods have not been successful in diffusing low impurity concentrations.

In the embodiments described above, the semiconductor wafer consisted of monoatomic materials such as silicon, germanium, and silicon-germanium alloys, while the doping agents utilized were those appropriate for these materials. It will be appreciated that by utilizing appropriate volatile compounds in the bubbler, other acceptors such as aluminum, gallium, and indium, and other donors such as arsenic and antimony, may be similarly utilized. Compound semiconductors such as gallium arsenide, inium phosphide, and the like may be similarly processed, utilizing appropriate acceptors and donors in each case.

In the previous example, the doped silicon oxide coating 34 covered an entire major wafer face, and the doping agent was subsequently diffused into the entire wafer portion immediately adjoining the coated major wafer face. It will be appreciated that precise control of the size and shape of the PN junctions introduced into semiconductive wafers may be obtained by removing predetermined portions of the doped silicon oxide coating prior to the diffusion step, or coating only selected portions therewith, as described in the following examples.

*Example IV*

A slice 41 of given conductivity type crystalline semiconductive material is prepared with two opposing major faces 42 and 43, as illustrated in FIGURE 4*a*. In this example, slice 41 consists of a P-type semiconductor such as monocrystalline gallium arsenide. Slice 41 is treated as described in Example II to deposit a doped silicon oxide coating 44 on one major face 43. The doping agent in coating 44 is selected from those which induce opposite conductivity type in the particular semiconductive material utilized. In this example, since slice 41 is P-type, the doping agent utilized is one which induces N-type conductivity in the slice, that is, a donor impurity. A suitable donor for gallium arsenide is sulphur.

Predetermined portions of coating 44 are now removed from slice 41 by any convenient technique. The most simple and direct method is to utilize grinding wheels or lapping tools to remove the undesired portions of coating 44, but this tends to injure the surface of the semiconductor. A very precise method is to utilize photoresists, as described in Example V below. In this example, an acid resist 49 is deposited on predetermined portions of coating 44. The acid resist 49 may consist of materials such as paraffin wax or apiezon wax. Conveniently, a suitably perforated steel mask (not shown) is positioned on slice 41 over silicon oxide coating 44, and the acid resist 49 is sprayed over the mask. The acid resist 49 is thus deposited on predetermined portions of coating 44, as illustrated in FIGURE *4b*.

Slice 41 is then treated with a solution of ammonium fluoride in hydrofluoric acid. Preferably the solution is buffered to pH 7. The solution dissolves those portions of silicon oxide coating 44 which are not protected by the acid resist 49. The remaining portions of the doped silicon oxide coating are shown as 44' in FIGURE *4c*. The acid resist is now removed by washing the slice in trichlorethylene.

Slice 41 is then heated in an inert ambient so as to diffuse the conductivity type modifier (sulphur in this example) from the remaining portions of the doped silicon oxide coating 44' directly into the immediately adjacent portions 45 of slice 41, as illustrated in FIGURE *4d*. The diffused portions 45 are thus converted to conductivity type possosite that of the original slice 41. Rectifying barriers or PN junctions 46 are formed at the boundaries between the opposite conductivity type portions 45 and the original given conductivity type bulk of slice 41.

The slice 41 is now cut along a set of planes *a—a*, and planes perpendicular to these planes, so as to separate slice 41 into a plurality of separate dies such as 41' in FIGURE *4e*. The dies are washed in trichlorethylene to remove any remaining portion of the acid resist 49, and treated with hydrofluoric acid ammonium fluoride solution to remove the remaining portions of the doped silicon oxide coating 44. To complete the individual units, a lead wire 47 is attached to major face 42' of each die 41', and a lead wire 48 is attached to the diffused portion 45 of major die face 43'. The completed unit 40 is illustrated in FIGURE *4e*.

An important advantage of the method of the invention is that the solid-to-solid diffusion of the impurity material from the doped silicon oxide coating to the semiconductive wafer avoids erosion of the wafer surface, such as occurs when sulphur is diffused into gallium arsenide wafers by the prior art methods of heating the wafer in an ambient containing sulphur vapors.

In Examples III and IV, the doped silicon oxide coating was removed from the completed unit. In some instances, it is desirable to leave the doped silicon coating on the semiconductive wafer in order to protect the PN junctions formed in the wafer, as described in the following example.

*Example V*

A slice 51 of given conductivity type crystalline semiconductive material is prepared with two parallel opposing major faces 52 and 53, as illustrated in FIGURE *5a*. In this embodiment, silce 51 consists of monocrystalline silicon doped with sufficient antimony so as to be of N-type conductivity and have a resistivity of about 2–4 ohm centimeters. Slice 51 is conveniently about 8–10 mils thick.

Both major faces 52 and 53 of slice 51 are masked for convenience, although the mask is only required on one face. A convenient mask is a layer of ordinary, that is, undoped silicon oxide. Such a silicon oxide layer 54 may be grown on faces 52 and 53 by heating slice 51 in oxygen or steam. Alternatively, the silicon oxide layer 54 may be formed on slice 51 by treating the slice with the vaporized decomposition products of a siloxane compound, as described in either Example I or Example II above, but without any doping agent dissolved in the siloxane compound.

The inert silicon oxide masking layer 54 on one major face 53 is covered with a first photoresist layer (not shown), and exposed to a predetermined pattern of ultraviolet light. The photoresist may consist of bichromated proteins such as albumin, gum arabic, gelatin, or the like. Commercially available photoresists may also be utilized. The photoresist layer is then developed and the unexposed portions thereof are removed. The slice 51 is next treated with the hydrofluoric acid-ammonium fluoride solution to dissolve those portions of the silicon oxide layer 54 which are not protected by the developed photoresist. The silicon oxide layer on major face 52 is removed completely by this treatment. Predetermined areas of major face 53 are thus exposed. One such exposed area 55 is illustrated in FIGURE *5b*. The remainder of the first photoresist layer is now removed by washing the slice in chromic acid-sulphuric acid mixture, or in hydrogen peroxide-sulphuric acid mixture.

Slice 51 is now treated as described in Examples I or II above to deposit a boron-doped silicon oxide coating 56 on major face 53 of slice 51, as illustrated in FIGURE *5c*. The boron-doped silicon oxide coating 56 is deposited on exposed areas 55 of face 53, and also on the remaining portions of the undoped or inert silicon oxide masking layer 54.

The first diffusion step is performed by heating the coated slice 51 at about 1200° C. for about one hour. Boron is thus diffused into those portions 57 of slice 51 which are immediately adjacent the previously exposed areas 55, as illustrated in FIGURE *5d*. The boron-diffused regions 57 of slice 51 are converted to P-type conductivity. Under the conditions of this example, the concentration of boron at the surface of wafer areas 55 is about $5\times10^{18}$ to $1\times10^{19}$ atoms per $cm.^3$, and the depth of the boron-diffused region 57 is about 0.1 mil. The thickness scale of the drawing has been exaggerated for greater clarity. A rectifying barrier or PN junction 58 is formed at the boundary between the P-type boron-diffused region 57 and the N-type bulk of slice 51.

A second photoresist layer (not shown) is now deposited on the doped silicon oxide coating 56, then exposed to a predetermined pattern of ultraviolet light, and developed. The undeveloped photoresist is removed, and the slice 51 treated with hydrofluoric acid-ammonium fluoride solution to remove those portions of silicon oxide coatings 54 and 56 which are not protected by the remaining photoresist. Areas such as 59 in FIGURE *5e* are thus exposed on face 53 of slice 51. Each area 59 constitutes a portion of the exposed surface of the boron-diffused P-type region 57. The remainder of the second photoresist layer is now removed by washing the slice in chromic acid-sulphuric acid mixture, or in hydrogen peroxide-sulphuric acid mixture.

Slice 51 is now treated as described in either Example I or Example II above to deposit a phosphorus-doped silicon oxide coating 60 over the exposed areas 59 of face 53, as illustrated in FIGURE *5f*. The phosphorus-doped silicon oxide coating 60 also covers the remaining portions of boron-doped silicon oxide coating 56 and the inert silicon oxide masking layer 54. A second diffusion step is now performed by heating the coated slice 51 at about 1100° C. for about 10–20 minutes. Phosphorus is thus diffused into those portions 61 (FIGURE *5g*) of slice 51 which are immediately adjacent the previously exposed areas 59. Under these conditions the depth of the phosphorus-diffused region 61 is about .07 mil. The phosphorus-diffused region 61 is thus completely surrounded by the boron-diffused region 57. Since the phosphorus-diffused region 61 is converted to N-type conductivity, a rectifying barrier or PN junction 62 is formed at the boundary between the phosphorus-diffused region 61 and the boron-diffused region 58.

A third photoresist layer (not shown) is now deposited on the phosphorus-doped silicon oxide coating 60; exposed to a predetermined pattern of ultraviolet light; and developed. The undeveloped photoresist is removed, and slice 51 treated with hydrofluoric acid-ammonium fluoride solution to remove those portions of the silicon oxide layers 60, 56 and 54 which are not masked by the remaining portions of the third photoresist layer. Predetermined areas 63 and 64 of face 53 are thus exposed, as illustrated in FIGURE *5h*. One such set of exposed areas 63 is completely within the set of phosphorus-diffused regions 61 of the slice. Another set of exposed areas 64 is conveniently ring-shaped, concentric to exposed areas 63, and is completely within the boron-diffused regions 57. The remainder of the third photoresist layer is removed by washing slice 51 in a chromic acid-sulphuric acid mixture.

An aluminum coating or layer 65 is now deposited, for example by evaporation, over the exposed areas 63 and 64, and over the remaining coated areas of face 53, as illustrated in FIGURE *5i*. A fourth photoresist layer (not shown) is now deposited on the aluminum layer 65, exposed to a predetermined pattern of the ultraviolet light, and developed. The unexposed portions of this photoresist layer are removed. The ultraviolet light pattern in this step is the reverse of the previous step, so that the portions of the aluminum layer 65 which are masked correspond to the previously exposed areas 63 and 64. The unmasked portions of aluminum layer 65 are removed by washing slice 51 in a solution of potassium hydroxide. Slice 51 is now subdivided into dies such as 51' (FIGURE *5j*) by cutting the slice along a set of planes *a—a* and along a second set of planes perpendicular to the first set. Alternatively, slice 51 may be diced into circular dies or segments.

A completed unit 50 is illustrated in FIGURE *5j*. The device 50 comprises semiconductive die 51' which contains a phosphorus-doped N-type emitter region 61, a metal contact 65' to the emitter region 61, a boron-doped P-type base region 57, an ohmic metal contact 65" to the base region, an emitter-base junction 62 and a base-collector junction 58. The unit thus fabricated is an NPN planar transistor. The silicon oxide coatings 54, 56 and 60 are not removed, since they protect the surface intercepts of junctions 58 and 62. To complete the unit, lead wires (not shown) are attached to contacts 65' and 65", an ohmic contact (not shown) to the collector region is made on face 52' of die 51', and the unit is potted and cased by any convenient technique known to the art.

It will be understood that the above examples are by way of illustration only, and not limitation, since various modifications may be made by those skilled in the art without departing from the spirit and scope of the invention.

What is claimed is:

A transistor comprising a given conductivity type crystalline semiconductive body having two opposing major faces; an opposite conductivity type region in said body adjoining one said major face; a rectifying barrier between said opposite type region and the bulk of said given type body; a coating of silicon oxide on a portion of the surface of said opposite type region, said coating containing a conductivity type modifier capable of inducing said opposite type conductivity in said body; a first metallic contact on a portion of the surface of said opposite conductivity type region; a given conductivity type region in said body adjoining said one major face, said given type region being surrounded by said opposite type region; a coating of silicon oxide on a portion of the surface of said given conductivity type region, said coating containing a conductivity type modifier capable of inducing said given conductivity type in said body; and a second metallic contact on a portion of the surface of said given conductivity type region.

References Cited

UNITED STATES PATENTS

| | | | |
|---|---|---|---|
| 2,816,850 | 12/1957 | Haring | 317—235 |
| 2,899,344 | 8/1959 | Atalla et al. | 317—235 |
| 2,981,877 | 4/1961 | Noyce | 317—235 |
| 2,989,424 | 6/1961 | Angello | 317—235 |
| 3,001,896 | 9/1961 | Marinace | 148—188 |
| 3,040,218 | 6/1962 | Byczkowski | 317—234 |
| 3,070,466 | 12/1962 | Lyons | 148—188 |
| 3,085,033 | 4/1963 | Handelman | 317—235 |
| 3,145,328 | 8/1964 | Letaw et al. | 317—235 |

JOHN W. HUCKERT, *Primary Examiner.*

R. F. POLISSACK, *Assistant Examiner.*